(12) United States Patent
Bell et al.

(10) Patent No.: US 10,756,710 B2
(45) Date of Patent: Aug. 25, 2020

(54) INTEGRATED RING OSCILLATOR CLOCK GENERATOR

(71) Applicant: CHAOLOGIX, INC., Gainesville, FL (US)

(72) Inventors: Timothy Arthur Bell, Melbourne Beach, FL (US); Daniel F. Yannette, Satellite Beach, FL (US)

(73) Assignee: CHAOLOGIX, INC., Gainesville, FL (US)

( * ) Notice: Subject to any disclaimer, the term of this patent is extended or adjusted under 35 U.S.C. 154(b) by 105 days.

(21) Appl. No.: 15/950,762

(22) Filed: Apr. 11, 2018

(65) Prior Publication Data

US 2018/0294801 A1    Oct. 11, 2018

Related U.S. Application Data

(60) Provisional application No. 62/484,355, filed on Apr. 11, 2017.

(51) Int. Cl.
*H03K 3/03*     (2006.01)
*H03K 3/86*     (2006.01)
*H03K 3/011*    (2006.01)

(52) U.S. Cl.
CPC .......... *H03K 3/0315* (2013.01); *H03K 3/011* (2013.01); *H03K 3/86* (2013.01)

(58) Field of Classification Search
CPC ......... H03K 3/0315; H03K 3/86; H03K 3/011
USPC ........................................................ 331/57
See application file for complete search history.

(56) References Cited

U.S. PATENT DOCUMENTS

| | | |
|---|---|---|
| 5,301,097 A | 4/1994 | McDaniel |
| 5,302,920 A | 4/1994 | Biting |
| 5,410,263 A | 4/1995 | Waizman |
| 5,436,939 A | 7/1995 | Co et al. |
| 5,548,251 A | 8/1996 | Chou et al. |
| 5,926,041 A | 7/1999 | Duffy et al. |
| 5,955,906 A | 9/1999 | Yamaguchi |
| 6,239,627 B1 | 5/2001 | Brown et al. |
| 6,388,492 B2 | 5/2002 | Miura et al. |
| 6,426,662 B1 | 7/2002 | Arcus |
| 6,856,208 B2 | 2/2005 | Lee et al. |
| 8,004,306 B2 * | 8/2011 | Takahashi ............... G11C 29/02 324/76.52 |

(Continued)

OTHER PUBLICATIONS

M.K. Mandal and B.C. Sarkar,"Ring oscillators: Characteristics and applications," Indian Journal of Pure & Applied Physics, Feb. 2010, pp. 136-145 (10 pages), vol. 48.

(Continued)

*Primary Examiner* — Jeffrey M Shin
(74) *Attorney, Agent, or Firm* — Talem IP Law, LLP

(57) ABSTRACT

A clock generator includes a series of inverting stages; and at least one combinational logic stage. The series of inverting stages is tapped at two or more locations along the series of inverting stages to provide intermediary outputs. A combinational logic stage of the at least one combinational logic stage is coupled to receive two or more of the intermediary outputs and generate a clock signal. Multi-phase, multi-duty cycle, non-overlapping clock signals can be generated by the clock generator based on different combinations of intermediary outputs. The clock signals can be provided to a switching network.

19 Claims, 9 Drawing Sheets

(56) References Cited

U.S. PATENT DOCUMENTS

| | | | | |
|---|---|---|---|---|
| 8,138,843 | B2* | 3/2012 | Straayer | G04F 10/005 |
| | | | | 324/76.54 |
| 8,912,816 | B2* | 12/2014 | Yannette | G06F 21/725 |
| | | | | 323/288 |
| 9,979,284 | B2* | 5/2018 | Jung | H02M 1/36 |
| 2014/0022023 | A1* | 1/2014 | Huang | H03K 3/0315 |
| | | | | 331/57 |
| 2015/0341040 | A1 | 11/2015 | Liu et al. | |

OTHER PUBLICATIONS

Le Duc Han, "All-digital Calibration Techniques of Timing Skews for Undersampling Time-Interleaved ADC's," These for Paris Institute of Technology, Dec. 15, 2015 (185 pages), Paris, France.

\* cited by examiner

INTEGRATED RING OSCILLATOR CLOCK GENERATOR

CROSS-REFERENCE TO RELATED APPLICATION

This application claims the benefit of U.S. Provisional Application No. 62/484,355, which was filed Apr. 11, 2017.

BACKGROUND

Oscillators, including ring oscillators, are used to generate clock signals in electronic systems. A ring oscillator is a circuit composed of an odd number of inverting stages. In its simplest form, a ring oscillator is composed of an odd number of NOT gates (e.g., a two-transistor inverter). The higher the number of gates, the longer the delay is available for the signal passing through the ring of gates. The operating frequency of the ring oscillator can be based, in part, on the number of gates that the signal passes through before being output.

BRIEF SUMMARY

An integrated ring oscillator clock generator can generate multi-phase, multi-duty cycle, non-overlapping clocks. In some implementations, the described integrated ring oscillator clock generator is configured to manage current consumption of a circuit, including minimizing the current draw on a power frame and the detectability of actions of the clock.

A clock generator is provided that includes a series of inverting stages and at least one combinational logic stage. The series of inverting stages is tapped at two or more locations along the series of inverting stages to provide intermediary outputs. The combinational logic stage is coupled to receive two or more of the intermediary outputs and generate a clock signal. The series of inverting stages can be tapped at locations and combined in a manner such the clock generator generates multi-phase, multi-duty cycle, non-overlapping clocks. An inverting stage can include delay circuitry such as, but not limited to, an inverter, a buffer, transistors, resistors, capacitors, diodes, or combinations thereof. A combinational logic stage can include one or more logic gates such as AND, NAND, OR, NOR, or combinations thereof.

A switching network can be spatially clocked at different points in time using one or more of the described ring oscillator clock generators. By spatially clocking the array (forming the switching network) at different points in time, the current draw of the circuitry can be reduced. In some implementations, different sections of a power frame that connects to power one or more circuits via a switching network can be clocked at different times.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

An integrated ring oscillator clock generator can generate multi-phase, multi-duty cycle, non-overlapping clocks. In some implementations, the described integrated ring oscillator clock generator is configured to manage current consumption of a circuit, including minimizing the current draw on a power frame and the detectability of actions of the clock.

The described integrated ring oscillator clock generator has the ability to generate integral, non-overlapping clocks of frequency (F) without the need for a faster clock such as 4F, 8F, 16F, . . . , etc. to generate the varying pulse widths. Multiple clock signals—each with different duty cycles can be obtained from the same ring oscillator by combining, via combinational logic, signals from taps of the ring oscillator.

Figure 1:
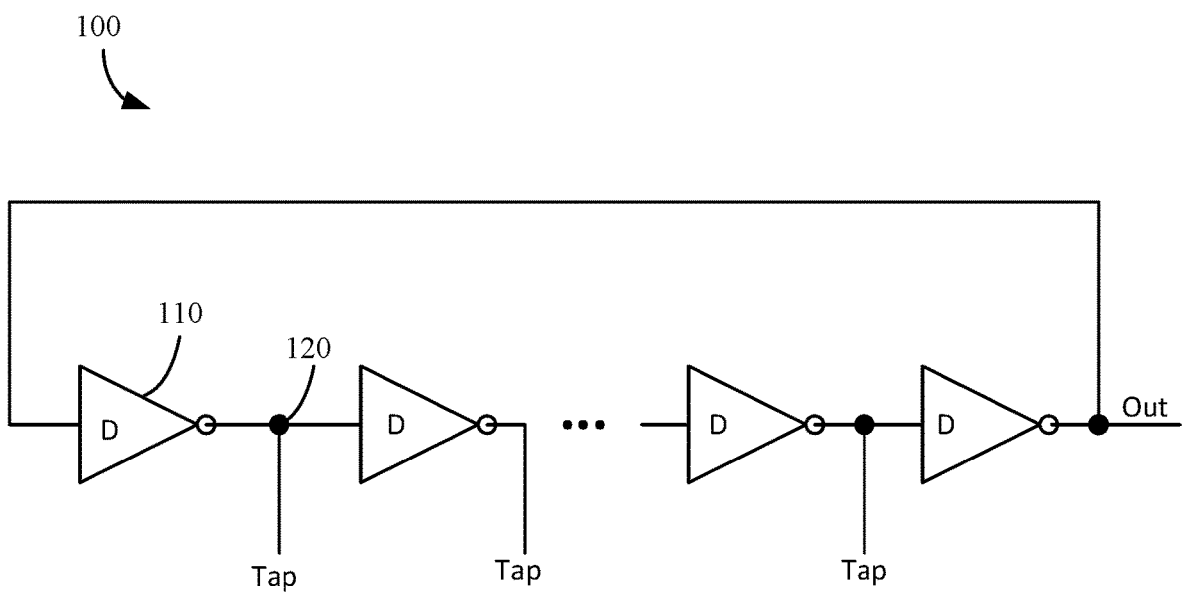
FIG. 1 shows a general schematic of an example integrated ring oscillator clock generator.

FIG. 1 shows a general schematic an example integrated ring oscillator clock generator. Referring to FIG. 1, a clock generator 100 can be in the form of a ring oscillator and include a plurality of inverting stages, each inverting stage 110 providing a delay and an output that may be tapped (e.g., at node 120). To form the ring, the last stage output (Out) is fed back to the input of the first stage. FIG. 1 shows four of five or more stages and three of four or more tap points. For a ring oscillator of N stages (where N is an odd number) there are N−1 tap points which are time offset by delay (D). The amount of delay provided by each stage may or may not be the same throughout the ring oscillator, depending on the implementation.

Figure 3:
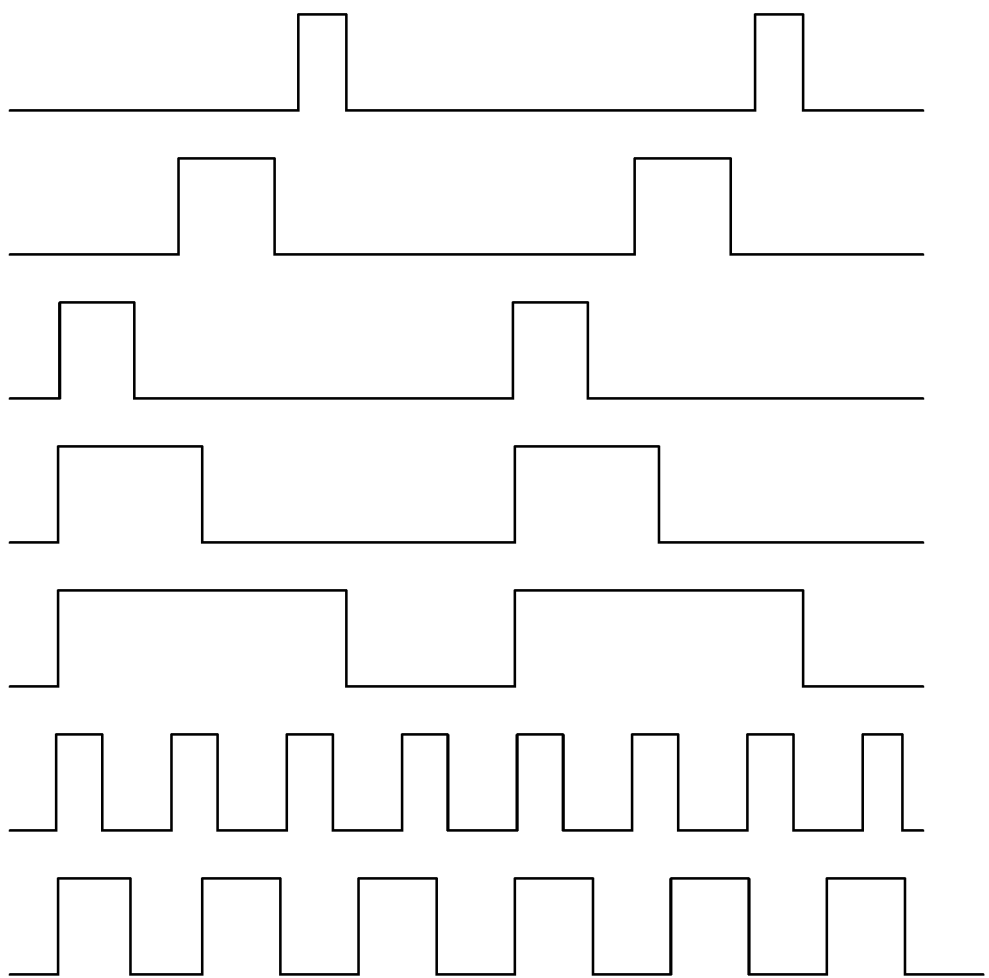
FIG. 3 shows representative clock signals that may be generated from a clock generator depending on the combinational logic implemented therein.

Using combinational logic (not shown), the signals tapped from the outputs of any of the stages can be combined to generate clocks of various periods and non-overlap times which are frequency locked to the oscillator. A combinational logic stage can include one or more logic gates such as AND, NAND, OR, NOR, or combinations thereof. Combining certain signals from taps of the inverting stages with appropriately delayed rising and/or falling edges can generate clock signals with desired pulse widths (or duty cycles). When multiple taps of the ring oscillator are combined with OR gates, the ring oscillator may further generate clock frequencies at multiples of the operating frequency of the ring oscillator (or at least provide multiple pulses within a period of the operating frequency of the ring oscillator). FIG. 3 shows representative clock signals that may be generated from a clock generator depending on the combinational logic implemented therein.

Depending on the components of the inverting stages, the clocking can proportionally scale as the oscillator frequency varies with process, voltage, and temperature changes. The clock signals can scale up or down consistently over process, voltage, and temperature. Through selection of the components (e.g., RC elements), the relationship between the clock signals can be maintained so that non-overlapping clock signals can remain non-overlapping even when there are process, voltage, and/or temperature variations.

Each delay stage may have a same or different circuitry therein. In some cases, a delay cell can be RC-based, in some cases, a string of inverters may be included in each delay cell, where some delay cells have more or fewer than other delay cells. In some cases, additional delay cells can be included in the ring oscillator so long as there is a total of an odd number of inverting stages. Examples of delay circuitry of the inverting stages include, but are not limited to, an inverter, a buffer, transistors, resistors, capacitors, diodes, or combinations thereof. The particular delay cell implementation can be based on desired characteristics over process, voltage, and temperature variations. For example, in some scenarios it may be desirable to maintain stability over process, voltage, and temperature variation; whereas in other scenarios it is desirable for the oscillator to shift, such as when there is shifting in the operation of a circuit driving the oscillator.

Where it is desirable for the oscillator to be adaptive, delay cells can be used that make oscillation adaptive, for example an inverter may be used as a delay cell. When an inverter, for example a CMOS inverter, is used as the delay cell, the characteristics of that delay cell would be a direct function of whatever variation and propagation delay occurs based on the device characteristics of the MOSFETs forming the CMOS inverter. When the delay cell incorporates an RC circuit, the variation would be a function of the shift in the resistance (R) and the capacitance (C). In some cases, a bias current may be incorporated in a delay cell with an inverter and the bias current can be adaptable based on a certain temperature coefficient. In some cases, threshold sensing circuitry can be incorporated such that the operation of the circuit is adjusted based on whether the supply (or some other signal) exceeds or falls below a threshold.

Figure 2:
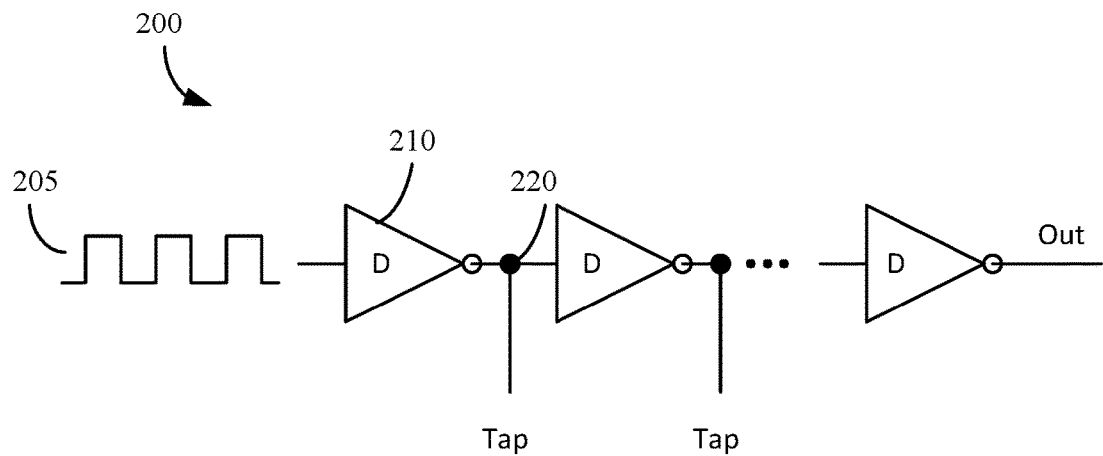
FIG. 2 shows a schematic of an alternate embodiment of a clock generator.

FIG. 2 shows a schematic of an alternate embodiment of a clock generator. Referring to FIG. 2, for clock generator 200, instead of a feedback loop forming a ring oscillator, an external oscillator 205 is used to drive a delay string. The delay string can be formed of a plurality of inverting stages, each inverting stage 210 providing a delay and an output that may be tapped (e.g., at node 220). Since clock generator 200 is not dependent on the stages to oscillate, the number of stages is not required to be an odd number. The signals at the tap points could still be used to generate non-overlapping clocks and combinational logic can be used to generate clocks of various periods and phases (in a manner such as described with respect to FIGS. 1 and 3). Similar to clock generator 100, the amount of delay provided by each stage may or may not be the same throughout the ring oscillator, depending on the implementation.

The tapped ring oscillator approach as illustrated in FIG. 1 (and alternatively in FIG. 2) can generate a specific type of multi-phase clock (non-overlapping) that can be used for switched-capacitor circuits and other switching networks.

Figure 4:
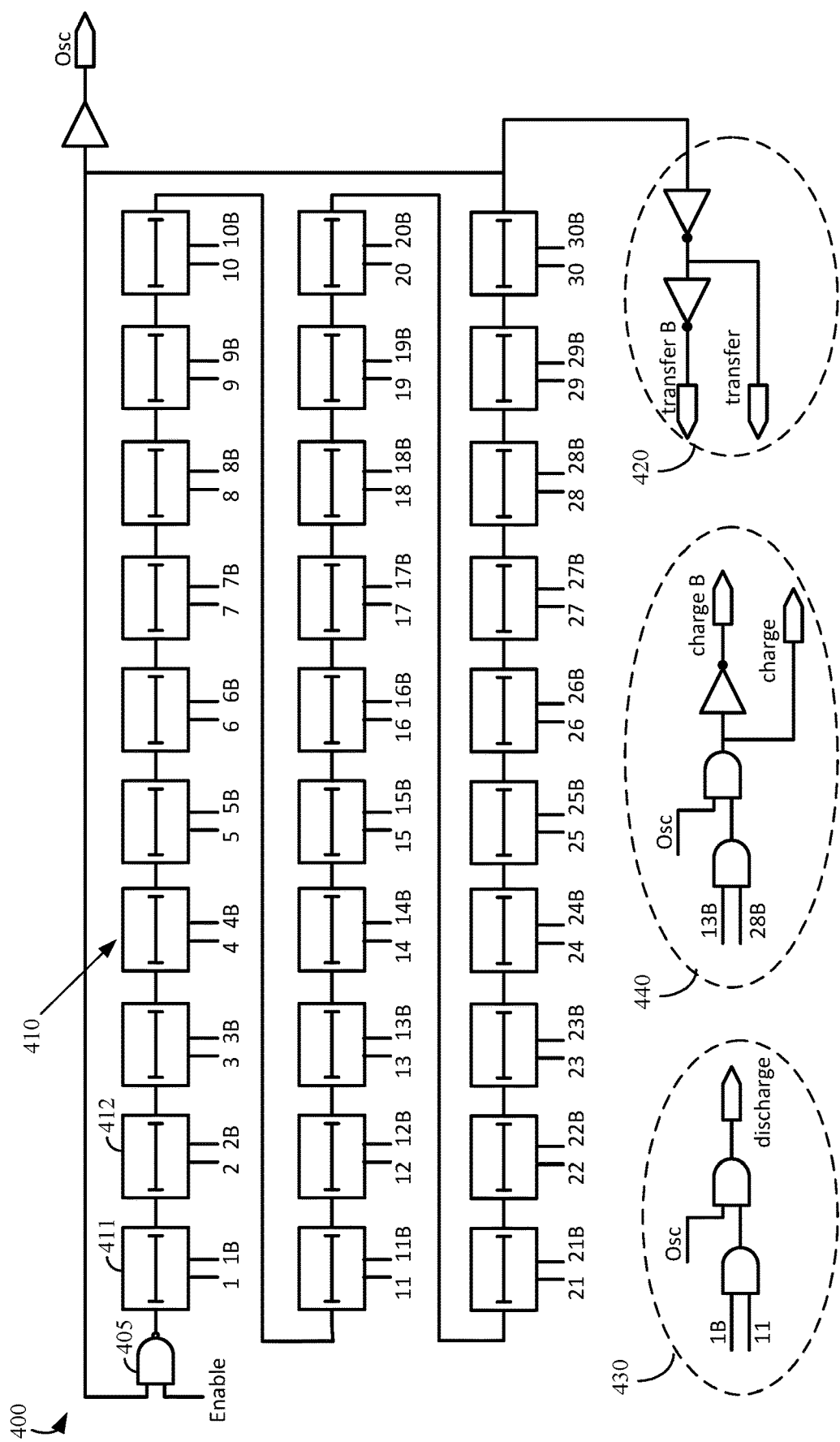
FIG. 4 shows a schematic of an example ring oscillator clock generator.

FIG. 4 shows a schematic of an example ring oscillator clock generator. Referring to FIG. 4, an example ring oscillator clock generator 400 is shown with 31 stages. Here, there is one NAND gate 405 (providing one of the inverting stages) and 30 custom delay stages 410 (providing the remaining inverting stages such that the total is an odd number). Each custom delay stage provides both true and inverted delay signals (e.g., inverting stage 411 has a tap for non-inverting output 1 and inverting output 1B; and inverting stage 412 has a tap for non-inverting output 2 and inverting output 2B). In the illustrated example, signals from stages 1, 11, 13, 28 (as 1B, 11, 13B, and 28B) and the oscillator output (420) are selected/tapped. These signals are combined using standard logic. For example, for a first combinational logic stage 430, signals 1B and 11 are input to a two-input AND gate and its output is connected as one input of another two-input AND gate whose other input is the OSC signal (oscillator output). In addition, for a second combinational logic stage 440, signals 13B and 28B are input to a two-input AND gate and its output is connected as one input of another two-input AND gate whose other input is the OSC signal. Although the illustrated example shows the oscillating output Osc being used as an input to the combinational logic, embodiments are not limited thereto.

Figure 5:
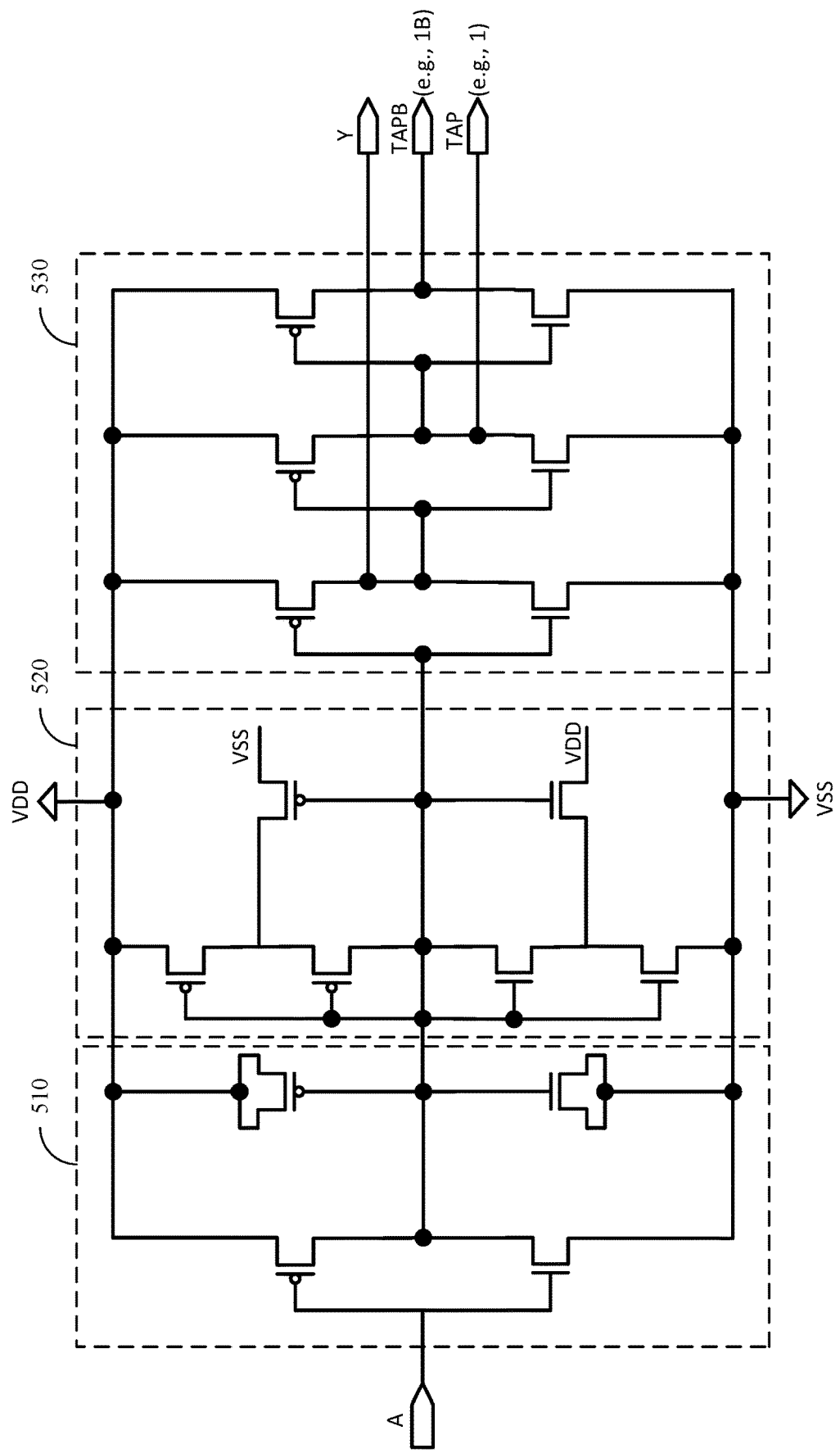
FIG. 5 shows an example delay cell schematic.

FIG. 5 shows an example delay cell schematic. Referring to FIG. 5, a delay cell 500 that may be used in the described clock generators can include a capacitive loaded inverter 510 followed by a Schmitt Trigger 520 and an output inverter 530. In some cases, the Schmitt Trigger 520 can be omitted. TAP and TAPB outputs are the buffered true and inverted delay signals. For example, if the delay cell 500 represents the inverting stage 411 in FIG. 4, TAP provides the non-inverting output 1 and TAPB provides the inverting output 1B. Input A is the input to the delay cell, which may be coupled to an output of a previous stage. For example, inverting stage 411 is coupled to the output of a previous stage, the NAND gate 405. Output Y is an inverting output that can be coupled to the next stage. For example, the inverting stage 411 is coupled to the next inverting stage 412. VDD and VSS are the voltage lines for the delay cell. These voltage lines can be coupled to a power supply.

The custom delay cell 500 can be used to implement any or all of the stages for a clock generator such as any or all of inverting stages 110 of FIG. 1, any or all of inverting stages 210 of FIG. 2, and any or all of custom inverting stages 410 of FIG. 4.

Figure 6:
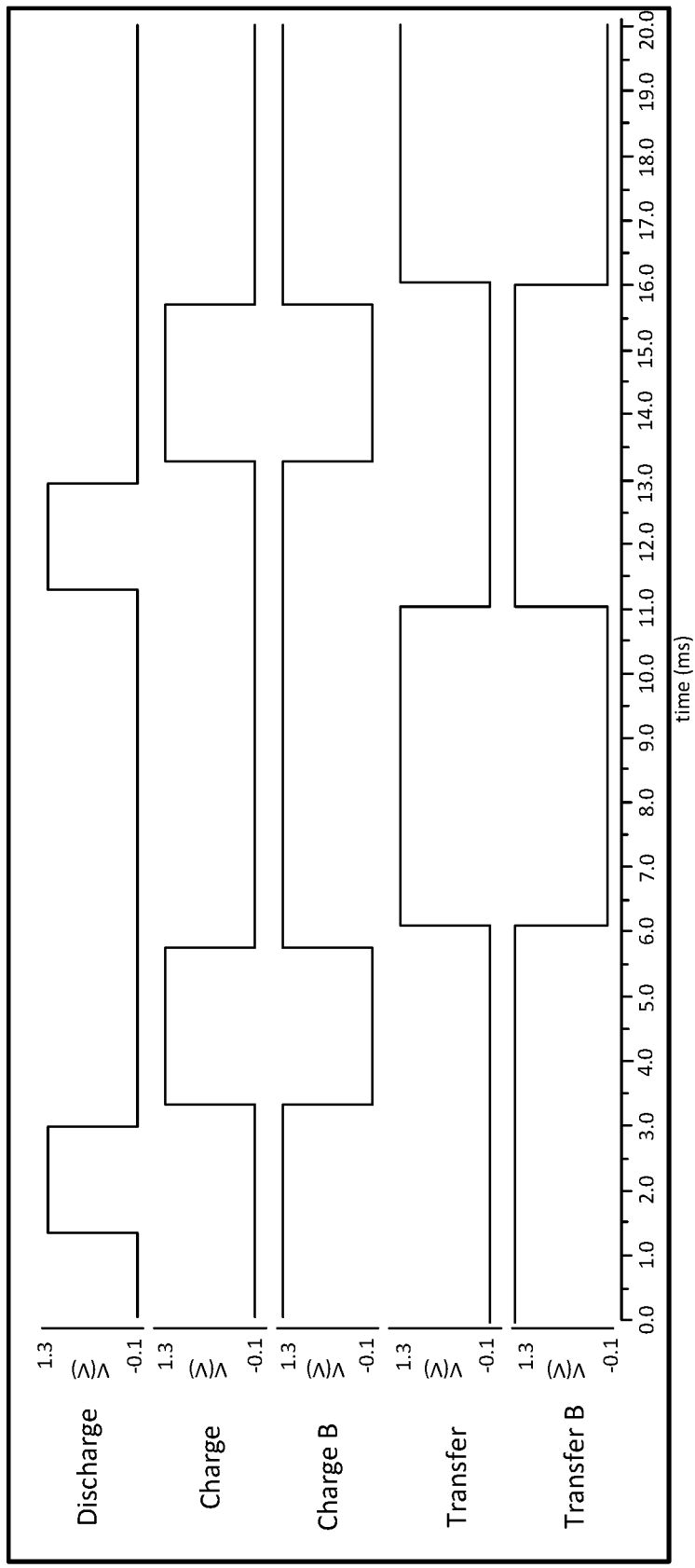
FIG. 6 is an example plot of the clock output generated from the schematic of FIG. 4.

FIG. 6 is an example plot of the clock output generated from the schematic of FIG. 4 (using the delay cell 500 for the custom delay stages 410). Three non-overlapping clock phases were created, 420, 430, and 440, with five total phases from one clock/oscillator. Two of the phases include complements. All derived clocks are frequency locked to the oscillator. The clock signals are labeled discharge, charge, charge B, transfer, and transfer B. It should be understood that any number of overlapping and non-overlapping clock phases may be possible through the combinational logic and a single ring oscillator.

In the example illustrated in FIG. 6, the three non-overlapping clock phases are shown suitable for a switching network (such as, but not limited to a switching network for secure systems such as described in U.S. Pat. No. 8,912,816, which is hereby incorporated in its entirety) to provide timing for charging and discharging one or more charge storage devices and connecting and disconnecting the charge storage devices to the circuitry to which the charge storage devices transfer power.

In addition to generating non-overlapping clock phases, the described clock generators can be configured to generate clocks to manage current consumption of a circuit. In some cases, some circuit elements, or "blocks", can be operated and a different time than other circuit elements. In some cases, when generating clocks for a switching network, the switching network can have some regions (parts of the array) operated at a different time than other regions. For example, if there is a large frame, it may be desirable to not have the whole frame toggle at the same time. When the whole frame is switching at the same time, very large current sources may occur throughout the array. The described clock generator can spread the operation of parts of a circuit across time based on the particular taps and combinational logic stages selected.

Figure 7:
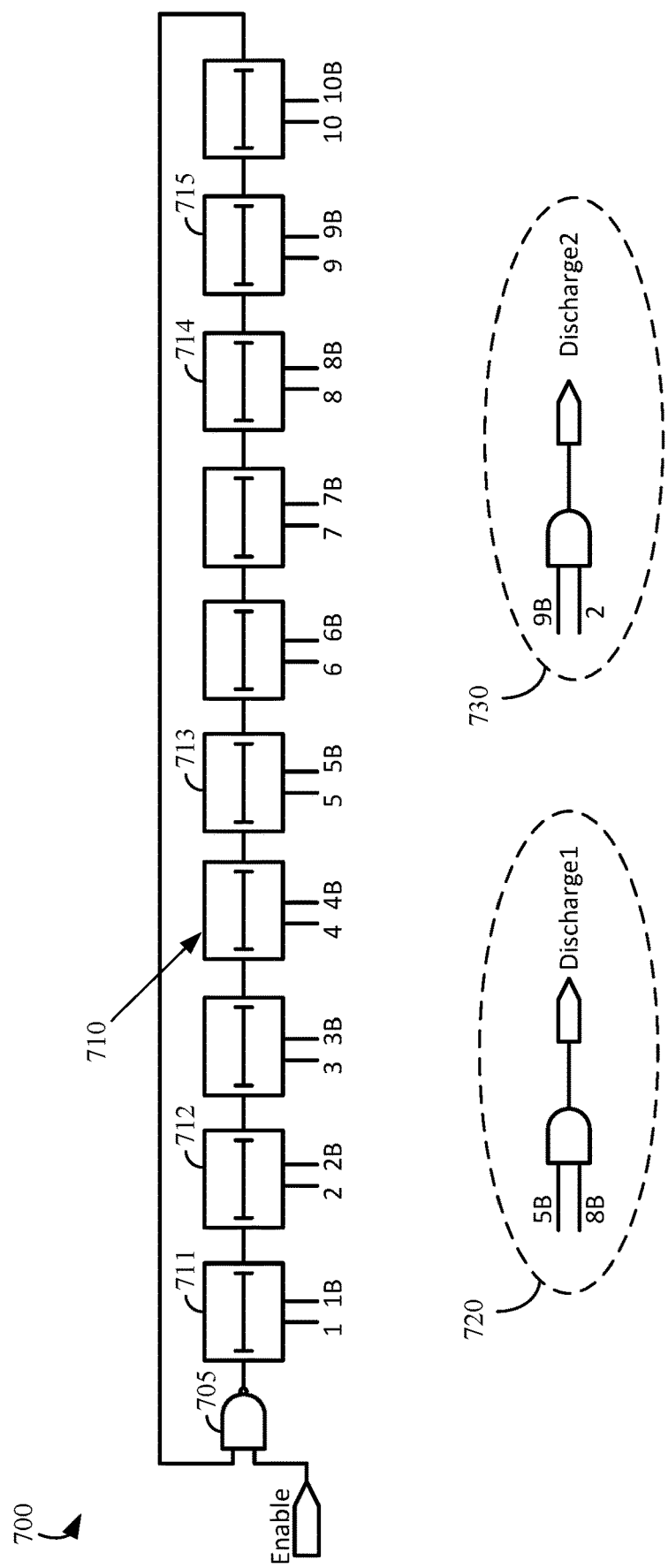
FIG. 7 shows a schematic of an example ring oscillator clock generator for providing clocks for different blocks.

FIG. 7 shows a schematic of an example ring oscillator clock generator for providing clocks for different blocks. A block is a grouping of circuit elements, such as switches. Referring to FIG. 7, an example ring oscillator clock generator 700 is shown with 11 delay stages. Each delay stage may be a same type of delay cell or different types of delay cells may be used. Here, there is one NAND gate 705 (providing one inverting stage) and 10 custom delay stages 710 (providing the remaining inverting stages). Delay stage 710 may be implemented using any suitable delay cell, including, but not limited to, the delay cell 500 illustrated in FIG. 5. In this example, each custom delay stage provides both true and inverted delay signals (e.g., inverting stage 711 has a tap for non-inverting output 1 and inverting output 1B; inverting stage 712 has a tap for non-inverting output 2 and inverting output 2B, inverting stage 713 has a tap for non-inverting output 5 and inverting output 5B; inverting stage 714 has a tap for non-inverting output 8 and inverting output 8B, and inverting stage 715 has a tap for non-inverting output 9 and inverting output 9B).

Two output signals that would drive two separate blocks are created (DISCHARGE1 and DISCHARGE2). The signals serve the same function for the differing blocks with DISCHARGE2 being phase delayed relative DISCHARGE1. This allows the operational activity of a circuit to be subdivide and phase delayed relative to one another. In the illustrated example, signals from inverting stages 712, 713, 714, and 715 (as 2, 5B, 8B, and 9B) are selected/tapped. These signals are combined using standard logic. For example, for a first combinational logic stage 720, signals 5B and 8B are input to a two-input AND gate to provide a clock signal labeled Discharge1. In addition, for a second combinational logic stage 730, signals 9B and 2 are input to a two-input AND gate to provide a clock signal labeled Discharge2.

Figure 8:
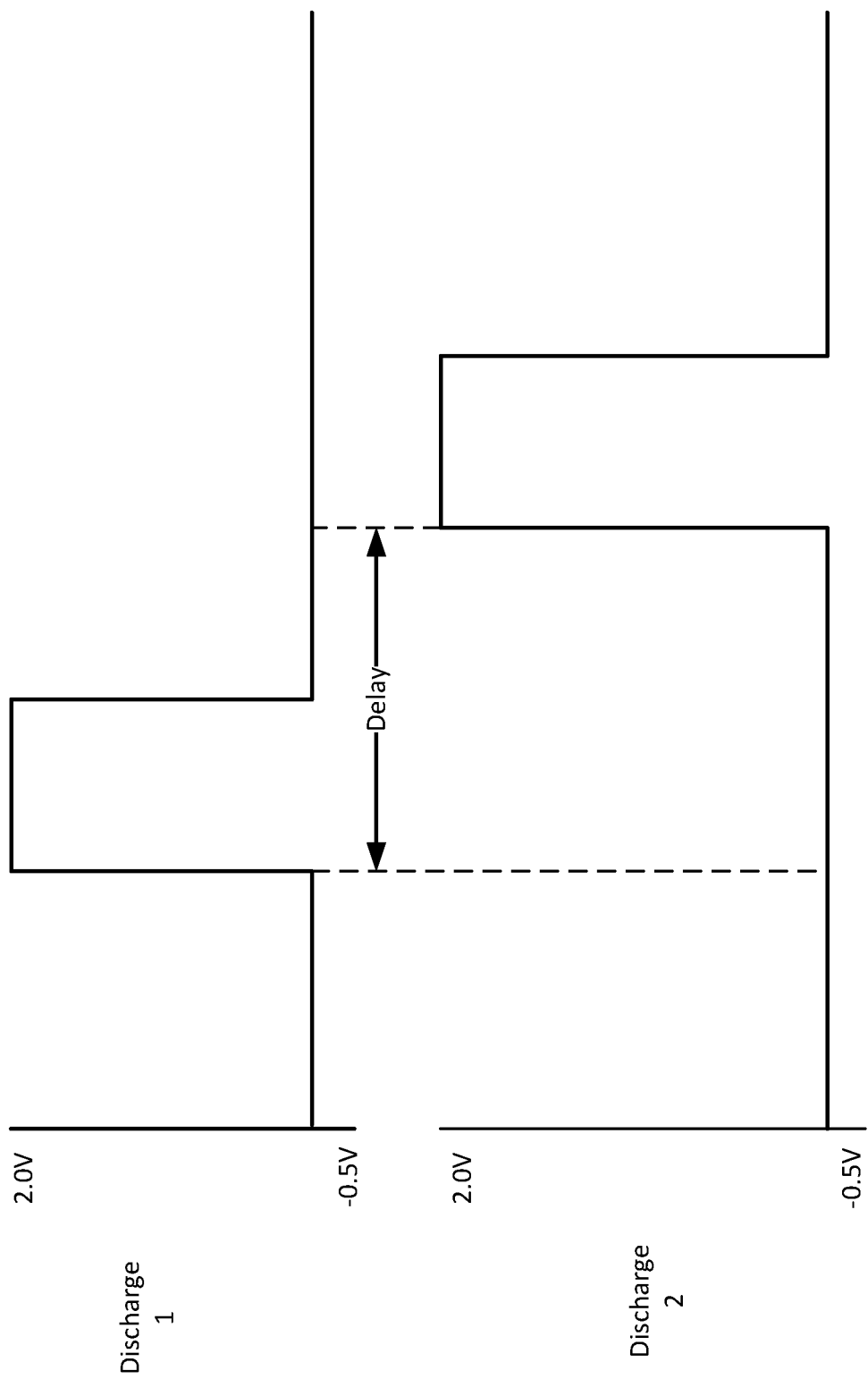
FIG. 8 is an example plot of the clock output generated from the schematic of FIG. 7.

FIG. 8 is an example plot of the clock output generated from the schematic of FIG. 7. As can be seen from the plot, the phase offset of the two discharge signals is the delay created by moving edge input from 5B of delay stage 713 to 9B of delay stage 715. These two discharge signals can be coupled to different blocks. The pulse width may be the same or different for the two clock signals. In this example, if each custom delay stage 710 is implemented with a same delay cell type, the pulse widths may be similar (but may not be exact, as the there is some additional delay from the signal passing through the NAND gate 705, but the non-inverting output of the delay stage 712 is used).

Output signals ("clocks") can be generated for N different blocks, where N is the number of delay stages in the clock generator, with the phase delay separating each signal for each block, for example, being T/N, where T is the period of the clock. This delay of each of the N signal would be accomplished by moving the input for each of the N signals to the appropriate subsequent tap from the delay chain.

Figure 9:
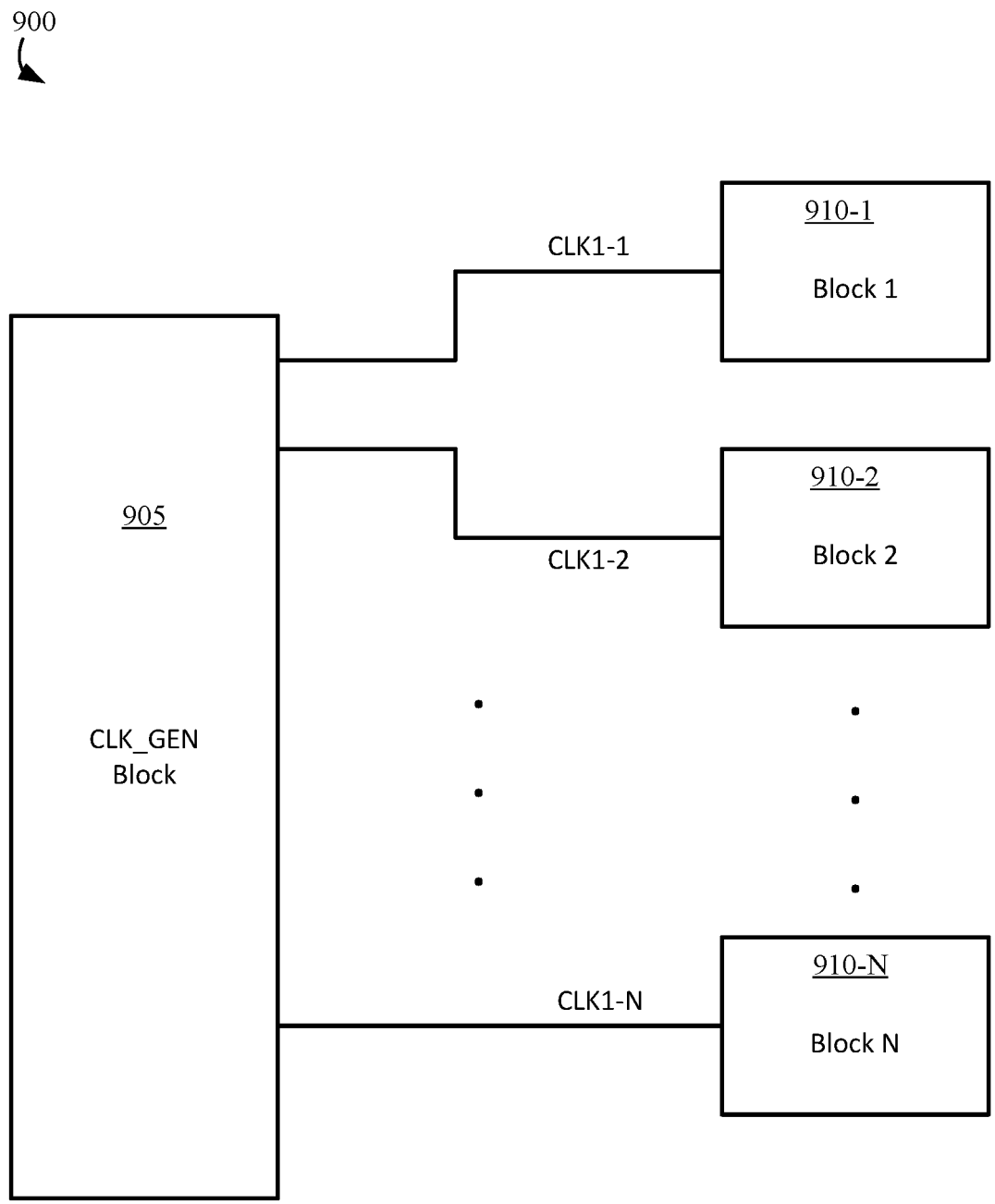
FIG. 9 shows an example system incorporating the described clock generator.

FIG. 9 shows an example system incorporating the described clock generator. Referring to FIG. 9, in example system 900, a clock generator 905 can be tapped at appropriate locations and combined using combinational stages to provide multi-phase, multi-duty cycle, non-overlapping clocks. Here, a CLK1 signal (CLK1-1, CLK1-2, . . . CLK1-N) is generated for N different circuit blocks (910-1, 910-2, . . . 910-N), where each CLK1 signal can have a non-overlapping phase with the others. Although not shown, the system 900 may include multiple clock generators coupled to a same or different circuit blocks. When coupled the same circuit blocks, the clock generators may be used to generate different switching signals (e.g., one clock generator to control CLK1 and another to control CLK2 for each block). When coupled to different circuit blocks, the clock generators may operate with similar taps (and phases) or with different taps to generate additional non-overlapping clock signals to manage the circuit blocks from different physical regions of the system.

Clock generator 905 may be implemented according to any of the examples described herein. For an example scenario that may include the clock generator configuration of FIG. 7, clock generator 905 may generate the discharge signal for a switching network by providing N discharge signals for the N different blocks of the switching network. In such an implementation, the same clock generator can be used to generate the charge signal (and even other signals for the switching network) for each of the N different blocks.

By breaking up a large switching network into smaller blocks, it is possible to reduce large current pulses that would otherwise arise from charging and discharging operations over a very large number of switches such as used in an isolation frame (e.g., a frame that isolates a circuit from a power supply through using a switching network and charge storage devices).

Figure 10A:
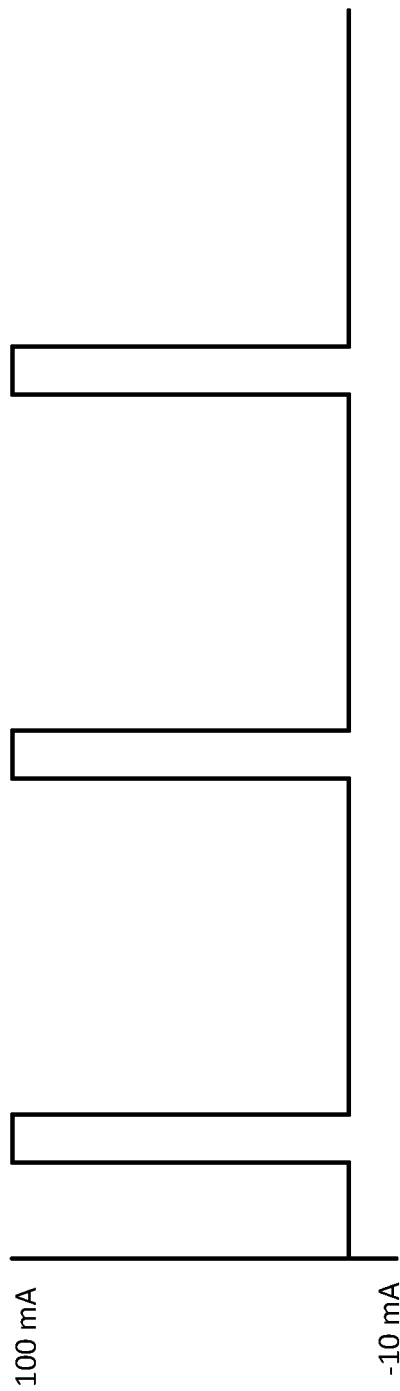
FIGS. 10A and 10B illustrate an effect of the configuration shown in FIG. 9 with respect to current spikes.
Figure 10B:
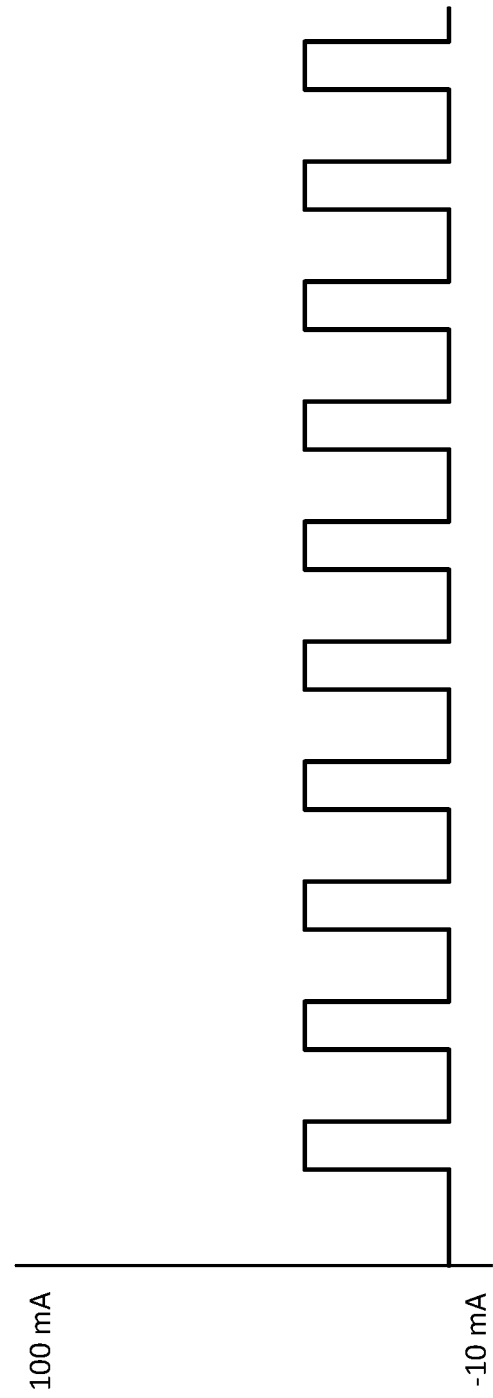

FIGS. 10A and 10B illustrate an effect of the configuration shown in FIG. 9 with respect to current spikes. Referring to FIG. 10A, when performing charging and discharging operations on a switching network, current spikes may occur. Large current spikes may be detrimental to circuit operation, for example by reducing the supply voltages to the circuit due to large IR drops and possible issues with circuit reliability due to electromigration effects. By breaking up the large frame into smaller blocks and applying a phased offset of the charge and discharge signals to each smaller block, the current pulses can be reduced and offset in time as shown in FIG. 10B. The phase delay of the clocking signals can result in smaller current peaks and a more DC-like profile for the supply current.

The described techniques can be applied to any application where it is desirable to minimize the current draw on the power frame. Multiple oscillators may be provided across different positions around the frame or a single oscillator may be used with multiple taps applied to the switching network. When multiple oscillators are used, there can be taps in different spots. In some implementations, different sections of the switching can be delayed such that charging and discharging can occur at different phase points in time. For example, if a switching network is grouped into 10 different sets of phase clocks coming out of the oscillator (formed of one or more of the described clock generators) so that 10% is charging at one point then the next 10% is charging on the next and the next and the next, the currents may be reduced by 90% as compared to if the switches in the switching network were firing all the same time.

Through the use of the combinational stages (e.g., combinational stages 430, 440, 720, and 730 of FIGS. 4 and 7), it is possible to generate signals at higher speeds than the operating frequency of the output of the oscillator. Different points within the delay stages can be tapped and combined to generate smaller pulses and desired periods. Appropriate selection and combination can be used to extend or reduce a pulse width and extend or reduce a duty cycle. Thus, it is possible to create clock signals that are controlled for how long the signal is "negative" or "low" and how long the signal is "positive" or "high".

Although the subject matter has been described in language specific to structural features and/or methodological acts, it is to be understood that the subject matter defined in the appended claims is not necessarily limited to the specific features or acts described above. Rather, the specific features and acts described herein are disclosed as example forms of implementing the claims.

What is claimed is:

1. A clock generator comprising:
a series of inverting stages; and
at least one combinational logic stage,
wherein the series of inverting stages is tapped at two or more locations along the series of inverting stages to provide intermediary outputs,
wherein a combinational logic stage of the at least one combinational logic stage is coupled to receive two or more of the intermediary outputs and generate a clock signal,
wherein the combinational logic stage comprises an AND gate, wherein a first of the two or more of the intermediary outputs coupled to a first input of the AND gate of the combinational logic stage is from one of the inverting stages and a second of the two or more of the intermediary outputs coupled to a second input of the AND gate of the combinational logic stage is from a different one of the inverting stages.

2. The clock generator of claim 1, wherein an output of a last inverting stage of the series of inverting stages is fed back to an input of a first inverting stage of the series of inverting stages.

3. The clock generator of claim 1, wherein the series of inverting stages comprises at least one inverting stage comprising an inverting output and a non-inverting output, wherein the inverting output is coupled to an adjacent inverting stage in the series of inverting stages.

4. The clock generator of claim 3, wherein the non-inverting output is coupled to the combinational logic stage and provides an intermediary output to the combinational logic stage.

5. The clock generator of claim 3, wherein the inverting output is further coupled to the combinational logic stage and provides an intermediary output to the combinational logic stage.

6. The clock generator of claim 1, comprising at least two combinational logic stages, each combinational logic stage outputting a corresponding clock signal.

7. The clock generator of claim 1, wherein the series of inverting stages is tapped at locations and combined in a manner such the clock generator generates multi-phase, multi-duty cycle, non-overlapping clocks.

8. The clock generator of claim 1, wherein each inverting stage of the series of inverting stages applies a time delay to a signal passing through that stage.

9. The clock generator of claim 8, wherein the inverting stages apply at least two different lengths of time delay.

10. The clock generator of claim 1, wherein an inverting stage of the series of inverting stages comprises a delay cell comprising:
a capacitive loaded inverter receiving an output of a previous inverting stage; and
an output inverter coupled to the capacitive loaded inverter, the output inverter providing a non-inverting delay signal and an inverting delay signal.

11. A system comprising:
a switching network;
a clock generator coupled to the switching network, comprising:
a series of inverting stages, wherein an output of a last inverting stage of the series of inverting stages is fed back to an input of a first inverting stage of the series of inverting stages; and
at least one combinational logic stage,
wherein the series of inverting stages is tapped at two or more locations along the series of inverting stages to provide intermediary outputs,
wherein a combinational logic stage of the at least one combinational logic stage is coupled to receive two or more of the intermediary outputs and generate a clock signal for the switching network,
wherein the combinational logic stage comprises an AND gate, wherein a first of the two or more of the intermediary outputs coupled to a first input of the AND gate of the combinational logic stage is from one of the inverting stages and a second of the two or more of the intermediary outputs coupled to a second input of the AND gate of the combinational logic stage is from a different one of the inverting stages.

12. The system of claim 11, wherein the clock generator is coupled to the switching network such that the switching network is spatially clocked at different points in time.

13. The system of claim 11, wherein the switching network is grouped into a plurality of blocks,
wherein the at least one combinational logic stage comprising at least two combinational logic stages, each of the at least two combinational logic stages coupled to a corresponding block of the plurality of blocks, and
wherein the clock signal is for a first clock for the switching network, each of the plurality of blocks receiving different phases of the first clock.

14. The system of claim 11, wherein the switching network is coupled to at least one charge storage device, the clock generator generating a first clock signal for discharging the at least one charge storage device, a second clock signal for charging the at least one charge storage device, and a third clock signal for transferring charge from the at least one charge storage device to a circuit, wherein the first clock signal, the second clock signal, and the third clock signal have non-overlapping phases.

15. The system of claim 11, wherein the clock generator comprises at least two combinational logic stages, each combinational logic stage outputting a corresponding clock signal.

16. The system of claim 11, wherein the series of inverting stages is tapped at locations and combined in a manner such the clock generator generates multi-phase, multi-duty cycle, non-overlapping clocks.

17. The system of claim 11, wherein each inverting stage of the series of inverting stages applies a time delay to a signal passing through that stage.

18. The system of claim 17, wherein the inverting stages apply at least two different lengths of time delay.

19. The system of claim 11, wherein an inverting stage of the series of inverting stages comprises a delay cell comprising:
a capacitive loaded inverter receiving an output of a previous inverting stage; and
an output inverter coupled to the capacitive loaded inverter, the output inverter providing a non-inverting delay signal and an inverting delay signal.

* * * * *